United States Patent
Koga et al.

(10) Patent No.: US 10,104,811 B2
(45) Date of Patent: Oct. 16, 2018

(54) VEHICLE CONTROL UNIT AND VEHICLE BRAKE SYSTEM

(71) Applicant: NISSIN KOGYO CO., LTD., Ueda, Nagano (JP)

(72) Inventors: Yusuke Koga, Nagano (JP); Sekihei Shimozono, Nagano (JP); Kouji Sakai, Nagano (JP); Fumiya Ohki, Nagano (JP); Naoki Tomita, Nagano (JP)

(73) Assignee: AUTOLIV NISSIN BRAKE SYSTEMS JAPAN CO., LTD., Nagano (JP)

( * ) Notice: Subject to any disclaimer, the term of this patent is extended or adjusted under 35 U.S.C. 154(b) by 0 days.

(21) Appl. No.: 15/061,270

(22) Filed: Mar. 4, 2016

(65) Prior Publication Data

US 2016/0278245 A1    Sep. 22, 2016

(30) Foreign Application Priority Data

Mar. 20, 2015  (JP) .................................. 2015-057150

(51) Int. Cl.
  *B60T 13/58*  (2006.01)
  *H05K 7/20*  (2006.01)
  (Continued)

(52) U.S. Cl.
  CPC ........ *H05K 7/20854* (2013.01); *B60T 13/146* (2013.01); *B60T 13/662* (2013.01); *B60T 13/686* (2013.01); *B60T 13/745* (2013.01)

(58) Field of Classification Search
  CPC ........ B60T 8/368; B60T 13/58; B60T 13/146; B60T 13/662; B60T 13/745; B60T 13/868; H05K 7/20854; H05K 7/1427
  (Continued)

(56) References Cited

U.S. PATENT DOCUMENTS 4,546,411 A   10/1985  Kaufman
5,957,547 A    9/1999  Schliebe et al.
(Continued)

FOREIGN PATENT DOCUMENTS

JP     2002515106         5/2002
JP   2006-269980 A      10/2006
(Continued)

OTHER PUBLICATIONS

Japanese Office Action in related JP Application No. 2015-057150, dated Jul. 25, 2017, 7 pages.
(Continued)

*Primary Examiner* — Xuan Lan Nguyen
(74) *Attorney, Agent, or Firm* — Andrew M. Calderon; Roberts Mlotkowski Safran Cole & Calderon, P.C.

(57) ABSTRACT

One embodiment relates to a vehicle control unit. The vehicle control unit includes a metallic base body and an electronic control unit which is attached to the base body. The electronic control unit includes a housing which is attached to an attaching surface of the base body and a control circuit board which is housed in the housing. A heat radiation portion is provided on the attaching surface so as to be inserted into the housing. The heat radiation portion is brought into abutment with the control circuit board via a heat conducting member. And, a heat conducting member holding portion is formed in the housing so as to hold the heat conducting member with respect to the heat radiation portion.

18 Claims, 6 Drawing Sheets

(51) Int. Cl.
　　　*B60T 13/14*　　　(2006.01)
　　　*B60T 13/66*　　　(2006.01)
　　　*B60T 13/68*　　　(2006.01)
　　　*B60T 13/74*　　　(2006.01)
(58) Field of Classification Search
　　　USPC .......................................... 303/119.2, 119.3
　　　See application file for complete search history.

(56) References Cited

U.S. PATENT DOCUMENTS

| | | | | |
|---|---|---|---|---|
| 6,634,723 | B1* | 10/2003 | Ganzel | B60T 8/368 303/119.3 |
| 8,447,485 | B2* | 5/2013 | Koyama | B60T 8/368 303/3 |
| 2007/0012421 | A1 | 1/2007 | Lin et al. | |
| 2008/0036292 | A1 | 2/2008 | Sakai et al. | |
| 2008/0060889 | A1* | 3/2008 | Tsuruta | B60T 8/3675 188/110 |
| 2010/0138126 | A1 | 6/2010 | Koyama | |
| 2011/0062775 | A1* | 3/2011 | Iyatani | B60T 8/368 303/20 |
| 2012/0195007 | A1* | 8/2012 | Yanai | B60T 13/686 361/720 |
| 2012/0298897 | A1* | 11/2012 | Nakamura | B60T 8/3675 251/129.15 |
| 2013/0232966 | A1* | 9/2013 | Murayama | B60T 7/042 60/545 |
| 2013/0333376 | A1 | 12/2013 | Murayama et al. | |
| 2013/0342999 | A1 | 12/2013 | Zhou et al. | |
| 2015/0327354 | A1 | 11/2015 | Umeno | |
| 2016/0113155 | A1* | 4/2016 | Koga | B60T 5/00 188/152 |

FOREIGN PATENT DOCUMENTS

| | | |
|---|---|---|
| JP | 2008062915 | 3/2008 |
| JP | 2010155605 | 7/2010 |
| JP | 2012106623 | 6/2012 |
| JP | 2013004423 | 1/2013 |
| JP | 2014007267 | 1/2014 |
| JP | 2015216141 | 12/2015 |
| WO | 9729310 | 8/1997 |

OTHER PUBLICATIONS

Chinese Office Action in related CN Application No. 201610158035.7, dated Jul. 17, 2018, 12 pages.

* cited by examiner

VEHICLE CONTROL UNIT AND VEHICLE BRAKE SYSTEM

CROSS-REFERENCE TO RELATED APPLICATION(S)

This application claims priority from Japanese Patent Application No. 2015-057150 filed on Mar. 20, 2015, the entire contents of which are incorporated herein by reference.

FIELD

The present invention relates to a vehicle control unit and a vehicle brake system.

BACKGROUND

For example, JP-2006-269980-A discloses an electronic control unit for use in a vehicle brake system. An electronic control unit for use in a vehicle brake system may include a box-shaped housing to be attached to a base body. The housing may houses a control circuit board and a metallic heat radiation plate therein, such that the heat radiation plate is attached to one surface of the control circuit board.

In such electronic control unit, heat of the control circuit board is conducted to the heat radiation plate, whereby the heat of the control circuit board is radiated.

In such electronic control unit, the heat radiation plate may be housed in the housing, and therefore, it may be difficult to provide the heat radiation plate having the large size. In addition, the heat radiation plate may be accommodated in a closed space within the housing. Consequently, it may be difficult to radiate the heat of the control circuit board.

SUMMARY

Aspect 1 of the invention provides a vehicle control unit including: a metallic base body; and an electronic control unit which is attached to the base body, wherein the electronic control unit includes: a housing which is attached to an attaching surface of the base body; and a control circuit board which is housed in the housing, wherein a heat radiation portion is provided on the attaching surface so as to be inserted into the housing, wherein the heat radiation portion is brought into abutment with the control circuit board via a heat conducting member having viscosity, and wherein a heat conducting member holding portion is formed in the housing so as to hold the heat conducting member with respect to the heat radiation portion.

In the above-described configuration, heat of the control circuit board is conducted from the heat radiation portion to the whole of the base body. Thus, a good abutment state can be provided between the heat radiation portion and the control circuit board via the heat conducting member, because a production or assembling tolerance between the heat radiation portion and the control circuit board is absorbed by the heat conducting member having viscosity, whereby the heat of the control circuit board is conducted to the base body through the heat conducting member efficiently. The base body is a metallic block which is disposed in a wide space such as an engine compartment, and therefore, heat from the base body is radiated efficiently. Consequently, even when the control circuit board has a great heat generation amount, the heat of the control circuit board can be radiated sufficiently through the base body.

Even when excessive vibrations are generated in the vehicle, the heat conducting member can be held to the heat radiation portion by the heat conducting member holding portion.

Aspect 2 of the invention provides, based on the above-described configuration, the vehicle control unit, wherein the heat conducting member holding portion is a cylindrical wall portion which surrounds the heat radiation portion.

In the above-described configuration, the heat conducting member can be prevented from scattering within the housing in an ensured fashion.

Aspect 3 of the invention provides, based on the above-described configuration, the vehicle control unit, wherein a gap is formed between an outer circumferential surface of the heat radiation portion and an inner circumferential surface of the wall portion.

In the above-described configuration, even when the heat conducting member expands around the circumference of the heat radiation portion, the heat conducting member can be kept remaining between the heat radiation portion and the wall portion, and therefore, the heat conducting member can be prevented from scattering within the housing.

Aspect 4 of the invention provides, based on the above-described configuration, the vehicle control unit, wherein the heat radiation portion projects from the attaching surface towards the control circuit board, and wherein the wall portion extends along a projecting direction of the heat radiation portion.

In the above-described configuration, the space where the heat conducting member is kept remaining expands over the full outer circumference of the heat radiation portion, and therefore, when the heat conducting member expands to the side of the heat radiation portion, the heat conducting member can be kept remaining between the heat radiation portion and the wall portion in an ensured fashion.

Aspect 5 of the invention provides, based on the above-described configuration, the vehicle control unit, wherein an electric component is attached to the attaching surface and wherein, in a state of being installed on a vehicle, the heat radiation portion is disposed below the electric component in a vertical direction.

In the above-described configuration, heat of the electric component is radiated upwards, and therefore, the heat of the electric component can be prevented from being conducted to the control circuit board through the heat radiation portion.

Further, since the heat conducting member hardly spreads upwardly, the heat conducting member can be prevented from adhering to the electric component.

Aspect 6 of the invention provides a vehicle brake system including: a master cylinder which generates a brake hydraulic pressure depending on a traveling amount of a brake operating member; a slave cylinder which generates a brake hydraulic pressure by driving an electric actuator; and the above-described vehicle control unit, wherein the electronic control unit of the vehicle control unit controls the electric actuator.

When the electronic control unit controls the operation of the vehicle control unit and the slave cylinder as in the vehicle brake system, the heat generation amount of the control circuit board becomes great. However, in the above-described configuration, the heat of the control circuit board can be radiated sufficiently through the base body.

According to the vehicle control unit and the vehicle brake system of the invention, the heat of the control circuit board can be radiated sufficiently through the base body, whereby the increase in temperature of the control circuit board can be restricted.

In addition, the heat conducting member can be held to the heat radiation portion by the heat conducting member holding portion.

BRIEF DESCRIPTION OF DRAWINGS

FIGS. 3A and 3B show the input unit according to the embodiment, of which FIG. 3A is a front view of the input unit and FIG. 3B is a rear view of the input unit.

DETAILED DESCRIPTION

An embodiment of a vehicle control unit will be described in detail by referring to the accompanying drawings as required.

In this embodiment, a vehicle control unit will be described as being applied to an input unit of a vehicle brake system.

In the following description, firstly, an overall configuration of a vehicle brake system will be described, and thereafter, an input unit as a vehicle control unit will be described in detail.

Figure 1:
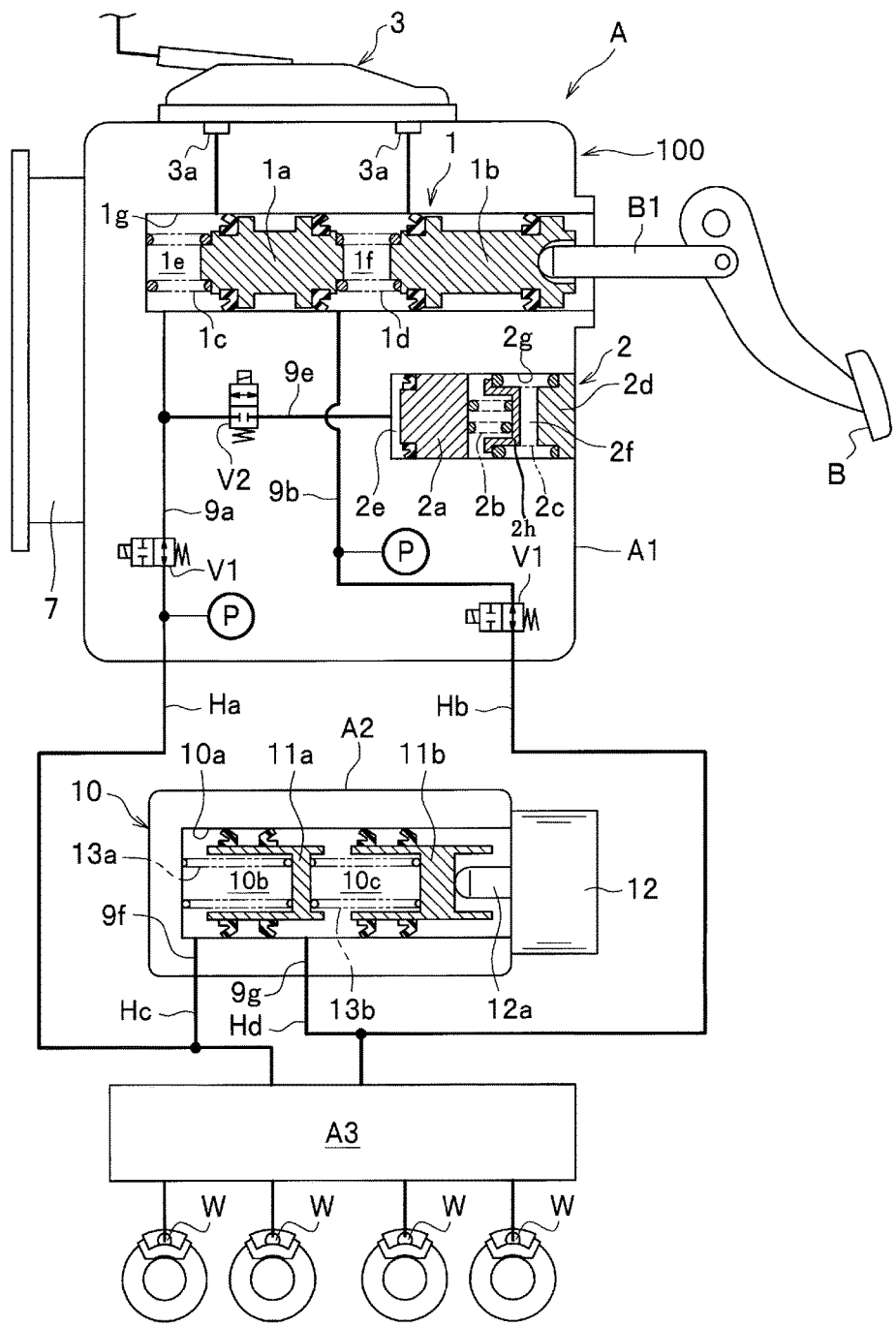
FIG. 1 is a schematic view showing a vehicle brake system which employs an input unit according to an embodiment.

As shown in FIG. 1, a vehicle brake system A includes both a brake-by-wire type brake system which is activated to operate when a prime mover (an engine or a motor) is activated and a hydraulic brake system which is activated when the prime mover is stopped.

The vehicle brake system A can be installed not only on a motor vehicle which employs only an engine (an internal combustion engine) as a power source but also on a hybrid electric vehicle which employs a motor in parallel with an engine as a power source and an electric vehicle or a fuel cell vehicle which employs only a motor as a power source.

The vehicle brake system A includes an input unit (a vehicle control unit) A1 which generates a brake hydraulic pressure depending on a stroke amount (a traveling or operation amount) of a brake pedal (a brake operating member) B.

The vehicle brake system A also includes a slave cylinder A2 which generates a brake hydraulic pressure by driving a motor (electric actuator) 12 depending on a stroke amount of the brake pedal B.

The vehicle brake system A includes further a hydraulic control unit A3 which assists in stabilizing the behavior of the vehicle.

The input unit A1, the slave cylinder A2 and the hydraulic control unit A3 are configured as separate units and communicate with one another via external piping.

Figure 2:
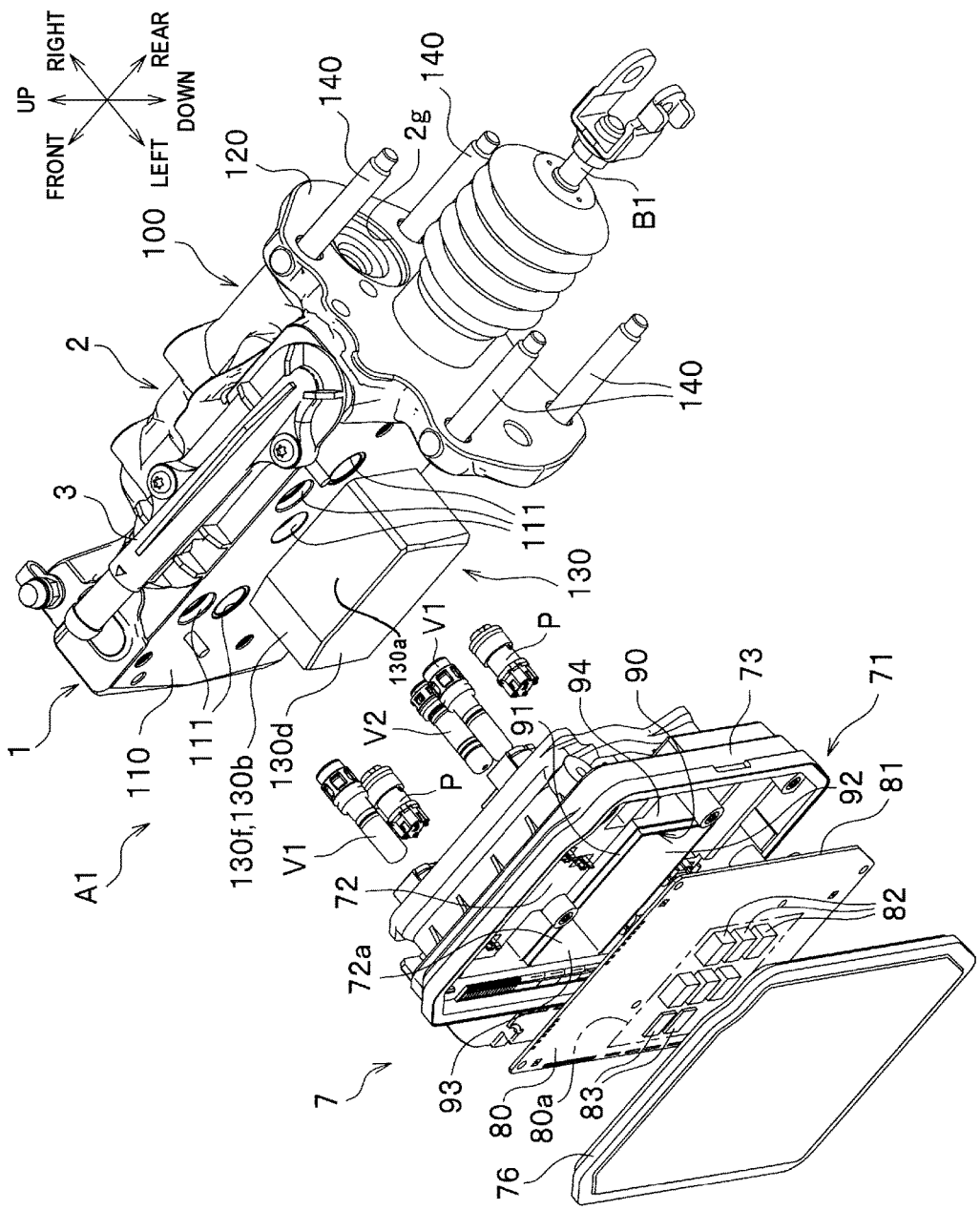
FIG. 2 is an exploded perspective view showing the input unit according to the embodiment.

The input unit A1 includes a base body 100, a master cylinder 1 which generates a brake hydraulic pressure depending on a stroke amount of the brake pedal B, a stroke simulator 2 which imparts a pseudo operation reaction force to the brake pedal B and an electronic control unit 7 (refer to FIG. 2).

The base body 100 is a metallic block which is installed on the vehicle, and two cylinder bores $1g$, $2g$ and plural hydraulic paths $9a$ to $9g$ are formed in the base body 100. Various components including a reservoir 3 are attached to the base body 100.

The master cylinder 1 is a tandem piston type master cylinder and is made up of two pistons $1a$, $1b$ and two coil springs $1c$, $1d$. The master cylinder 1 is provided in the first cylinder bore $1g$ which is a bottomed cylindrical bore.

A first pressure chamber $1e$ is formed between a bottom surface of the first cylinder bore $1g$ and the first piston $1a$. The coil spring $1c$, which is a first coil spring $1c$, is accommodated in the first pressure chamber $1e$. The first coil spring $1c$ pushes back the first piston $1a$ which has moved to a bottom surface side of the first cylinder bore $1g$ to an opening portion side thereof.

A second pressure chamber $1f$ is formed between the first piston $1a$ and a second piston $1b$. A second coil spring $1d$ is accommodated in the second pressure chamber $1f$. The second coil spring $1d$ pushes back the second piston $1b$ which has moved towards the bottom surface side of the first cylinder bore $1g$ to the opening portion side thereof.

A rod B1 of the brake pedal B is inserted into the first cylinder bore $1g$. The second piston $1b$ is connected to a distal end portion of the rod B, whereby the second piston $1b$ is connected to the brake pedal B via the rod B1.

The first piston $1a$ and the second piston $1b$ receive depression effort exerted on the brake pedal B and slide towards the bottom surface side in the first cylinder bore $1g$ to thereby pressurize brake fluid in both the pressure chambers $1e$, $1f$.

The reservoir 3 is a vessel which reserves the brake fluid and is attached to the upper surface of the base body 100 (refer to FIG. 2). The brake fluid is supplied from the reservoir 3 to the two pressure chambers $1e$, $1f$ through communication holes $3a$, $3a$.

The stroke simulator 2 is made up of a piston $2a$, two coil springs $2b$, $2c$, a spring connector $2h$ and a lid member $2d$. The stroke simulator 2 is provided in the second cylinder bore $2g$ having a bottomed cylindrical shape. An opening portion of the second cylinder bore $2g$ is closed by the lid member $2d$.

A pressure chamber $2e$ is formed between a bottom surface of the second cylinder bore $2g$ and the piston $2a$. An accommodating chamber $2f$ is formed between the piston $2a$ and the lid member $2d$. Two coil springs $2b$, $2c$ are accommodated in the accommodating chamber $2f$. Both the coil springs $2b$, $2c$ are connected via the spring connector $2h$. Both the coil springs $2b$, $2c$ push back the piston $2a$ which has moved towards a lid member $2d$ towards a bottom surface side of the second cylinder bore $2g$ and impart an operation reaction force to the brake pedal B.

Next, the hydraulic paths formed in the base body 100 of the input unit A1 will be described.

A first main hydraulic path $9a$ originates from the first pressure chamber $1e$ of the first cylinder bore $1g$. Piping Ha, which reaches the hydraulic control unit A3, is connected to an output port which configures a terminating point of the first main hydraulic path $9a$.

A second hydraulic path $9b$ originates from the second pressure chamber $1f$ of the first cylinder bore $1g$. Piping Hb, which reaches the hydraulic control unit A3, is connected to an output port which configures a terminating point of the second main hydraulic path $9b$.

A branch hydraulic path 9e branches of the first main hydraulic path 9a to reach the pressure chamber 2e of the stroke simulator 2.

A normally open solenoid valve V1, which is configured to open and close the first main hydraulic path 9a, is provided on a downstream side (an output port side) of a connecting portion with the branch hydraulic path 9e in the first main hydraulic path 9a. This solenoid valve V1 is a master cutoff valve which cuts off a communication between an upstream side and a downstream side of the first main hydraulic path 9a when switched to a closed state.

A normally open solenoid valve V1, which is configured to open and close the second main hydraulic path 9b, is provided on the second main hydraulic path 9b. This solenoid valve V1 is a master cutoff valve which cuts off a communication between an upstream side and a downstream side of the second main hydraulic path 9b when switched to a closed state.

A normally closed solenoid valve V2 is provided on the branch hydraulic path 9e. This solenoid valve V2 is configured to open and close the branch hydraulic path 9e.

Two pressure sensors P, P detect the magnitude of a brake hydraulic pressure. Information acquired by the pressure sensors P, P is outputted to the electronic control unit 7.

The pressure sensor P of the first main hydraulic path 9a is disposed on a downstream side (an output port side) of the solenoid valve V1 and detects a brake hydraulic pressure generated in the slave cylinder A2.

The pressure sensor P of the second main hydraulic path 9b is disposed on a upstream side (a master cylinder 1 side) of the solenoid valve V1 and detects a brake hydraulic pressure generated in the master cylinder 1.

The electronic control unit 7 controls the opening and closing of the solenoid valves V1, V2 and the operation of a motor 12 of the slave cylinder A2 based on the information acquired from the various sensors such as the pressure sensors P and the stroke sensor and inputted thereinto and a program stored therein in advance.

The slave cylinder A2 includes a base body 10 having a bottomed cylindrical cylinder bore 10a, slave pistons ha, 11b which slide in the cylinder bore 10a and the motor 12.

The base body 10 is a metallic component which is installed on the vehicle, and the cylinder bore 10a is formed in the base body 10. Various components such as a reservoir is attached to the base body 10.

A first pressure chamber 10b is formed between a bottom surface of the cylinder bore 10a and a first slave piston 11a. A first coil spring 13a is accommodated in the first pressure chamber 10b. The first coil spring 13a pushes back the first slave piston 11a which has moved to a bottom surface side of the cylinder bore 10a towards an opening portion side thereof.

A second pressure chamber 10c is formed between the first slave piston 11a and a second slave piston 11b. A second coil spring 13b is accommodated in the second pressure chamber 10c. The second coil spring 13b pushes back the second slave piston 11b which has moved to the bottom surface side towards the opening portion side.

The motor 12 is an electric servomotor which is controlled to be driven by the electronic control unit 7 of the input unit A1.

The motor 12 is attached to a side surface of the base body 10. A rod 12a projecting from the motor 12 is inserted into the cylinder bore 10a.

A drive transmitting portion, which is configured to convert a rotational driving force of an output shaft of the motor 12 into a linear axial force, is accommodated in a case of the motor 12. The drive transmitting portion is made up of for example, a ball screw mechanism. When the rotational driving force of the output shaft of the motor 12 is inputted into the drive transmitting portion, a linear axial force is imparted to the rod 12a from the drive transmitting portion, whereby the rod 12a reciprocates in an axial direction thereof.

A distal end portion of the rod 12a is in abutment with the second slave piston 11b. Then, when the rod 12a moves to the bottom surface side of the cylinder bore 10a, the slave pistons 11a, 11b receive an input from the rod 12a and slide in the cylinder bore 10a, whereby the brake fluid in the pressure chambers 10b, 10c is pressurized.

Next, hydraulic paths formed in the base body 10 of the slave cylinder A2 will be described.

A first communication hydraulic path 9f originates from the first pressure chamber 10b of the cylinder bore 10a. Piping He which branches off the piping Ha is connected to an output port which is a terminating point of the first communication hydraulic path 9f.

A second communication hydraulic path 9g originates from the second pressure chamber 10c of the cylinder bore 10a. Piping Hd which branches off the piping Hb is connected to an output port which is a terminating point of the second communication hydraulic path 9g.

The hydraulic control unit A3 controls a brake hydraulic pressure which is imparted to wheel cylinders W of wheel brakes and is configured to execute an anti-lock braking control, a skid control to stabilize the behavior of the vehicle and a traction control.

Although an illustration thereof is omitted, the hydraulic control unit A3 includes a hydraulic unit in which a solenoid valve and a pump are provided, a motor to drive the pump, and an electronic control unit to control the solenoid valve and the motor.

The hydraulic control unit A3 is connected to the input unit A1 via the piping Ha and the piping Hb and is connected to the salve cylinder A2 via the piping Ha and the piping He, and the piping Hb and the piping Hd. The hydraulic control unit A3 is connected to the wheel cylinders W via pieces of piping.

Next, the operation of the vehicle brake system A will briefly be described.

In the vehicle brake system A, when the vehicle brake system A is activated to operate, the electronic control unit 7 switches the states of the normally open solenoid valves V1, V1 to closed states, whereby a communication between the upstream side and the downstream side of the both main hydraulic paths 9a, 9b is cut off.

The electronic control unit 7 opens the normally closed solenoid valve V2, whereby a communication from the first main hydraulic path 9a to the branch hydraulic path 9e is established to allow the brake fluid to flow into the stroke simulator 2.

The two pistons 1a, 1b of the master cylinder 1 receive the depression effort exerted on the brake pedal B and slide towards the bottom surface side in the first cylinder bore 1g, thereby pressurizing the brake fluid in the two pressure chambers 1e, 1f. As this occurs, the communication between the upstream side and the downstream side of the both main hydraulic paths 9a, 9b is cut off, and therefore, the brake hydraulic pressures generated in the both pressure chambers 1e, 1f are not transmitted to the wheel cylinders W.

When the brake fluid in the first pressure chamber 1e is pressurized, the brake fluid flows from the first main hydraulic path 9a into the branch hydraulic path 9e. Then, the brake fluid in the pressure chamber 2e of the stroke simulator 2 is pressurized, whereby the piston 2a moves towards the lid member 2d against the biasing force of the coil springs 2h, 2c.

This strokes the brake pedal B, and a biasing force directed towards the bottom surface is generated in the piston 2a by the coil springs 2b, 2c, whereby a pseudo operation reaction force is imparted to the brake pedal B from the piston 2a.

When the depression of the brake pedal B is detected by the stroke sensor, the motor 12 of the slave cylinder A2 is driven.

The electronic control unit 7 compares the brake hydraulic pressure outputted from the slave cylinder A2 with the brake hydraulic pressure outputted from the master cylinder 1 and controls the revolution speed of the motor 12 based on the results of the comparison.

In the slave cylinder A2, the two slave pistons 11a, 11b receive the input from the rod 12a and slide towards the bottom surface in the cylinder bore 10a, whereby the brake fluid in the two pressure chambers 10b, 10c is pressurized.

In this way, in the slave cylinder A2, the brake hydraulic pressure is generated depending on the stroke amount of the brake pedal B.

The brake hydraulic pressure generated in the slave cylinder A2 is inputted into the hydraulic control unit A3 from the piping He and the piping Hd through the piping Ha and the piping Hb.

The brake hydraulic pressure is transmitted to the wheel cylinders W from the hydraulic control unit A3, whereby the wheel cylinders W are activated to operate, thereby a braking force being imparted to the wheels.

In such a state that the slave cylinder A2 is inoperable (for example, no electric power is available), the two solenoid valves V1, V1 are kept open, and the upstream side and the downstream side of the two main hydraulic paths 9a, 9b communicate with each other. The solenoid valve V2 is closed.

In this state, the brake hydraulic pressures in the two main hydraulic paths 9a, 9b are raised by the master cylinder 1. Then, the wheel cylinders W which communicate with the both main hydraulic paths 9a, 9b are activated, whereby the braking force is imparted to the wheels.

Next, the input unit A1 of this embodiment will be described in detail.

As shown in FIG. 2, the input unit A1 includes the base body 100, the master cylinder 1 and the stroke simulator A2 which are provided in the interior of the base body 100 and the electronic control unit 7 attached to an attaching surface 110 of the base body 100.

The input unit A1 is attached to a front surface of a dashboard which separates the engine compartment from a passenger compartment.

The base body 100 is the metallic block and is formed so that it expands more in a front-to-rear direction than in a left-to-right direction. A rear end portion of the base body 100 is made wider in the left-to-right direction.

In this embodiment, when referred to herein, the front-to-rear direction, the left-to-right direction and an up-to-down direction of the base body 100 denote those directions resulting when the input unit A1 is installed on the vehicle.

Figure 4:
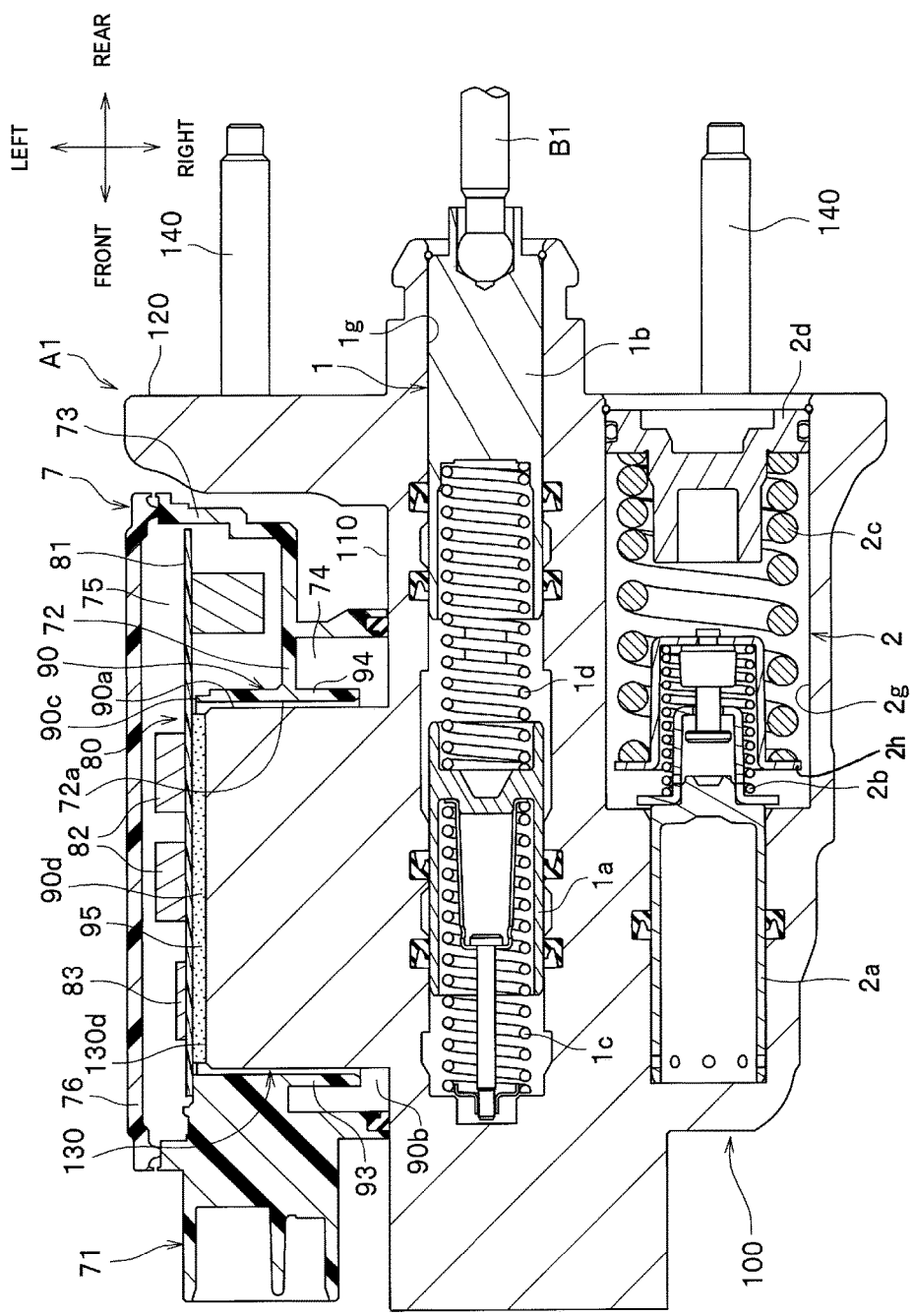
FIG. 4 is a sectional view of the input unit according to the embodiment taken along a line A-A in FIG. 3A.

As shown in FIG. 4, the first cylinder bore 1g of the master cylinder 1 and the second cylinder bore 2g of the stroke simulator 2 are formed in the interior of the base body 100. The two cylinder bores 1g, 2g are provided in parallel in a left-to-right direction of the vehicle and extend in a front-to-rear direction of the vehicle.

Figure 3A:
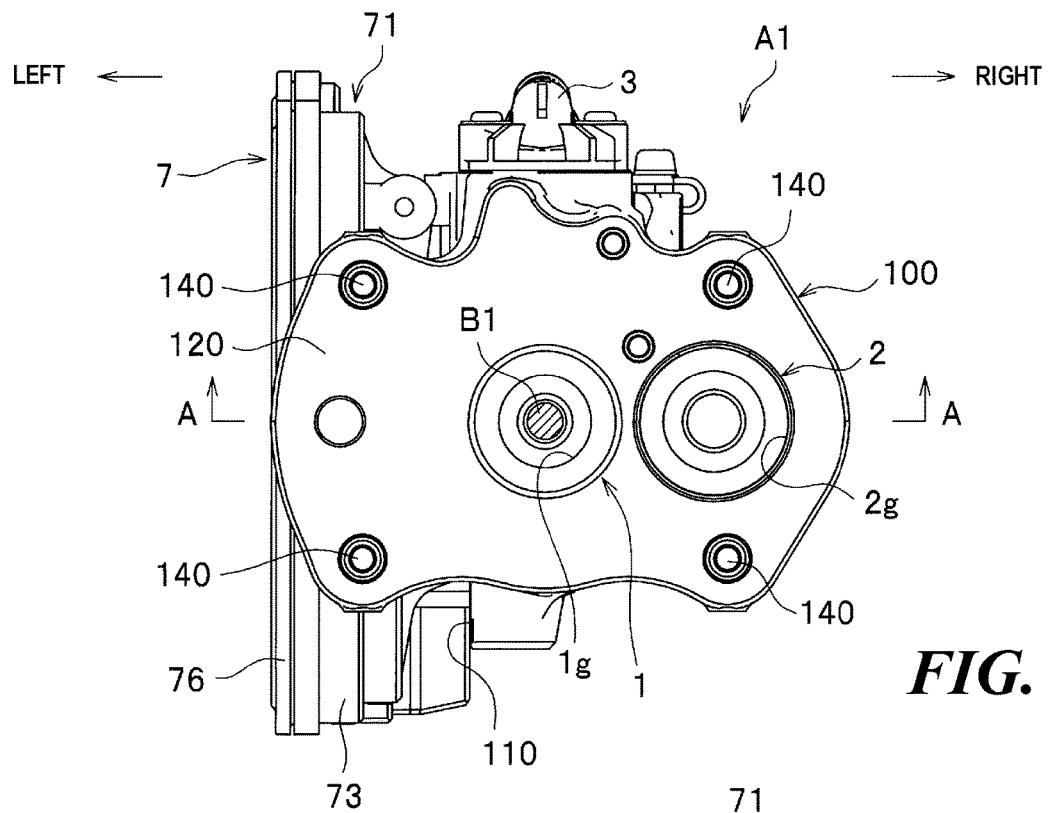

In this embodiment, as shown in FIG. 3A, the first cylinder bore 1g is disposed in a central portion of the base body 100, and the second cylinder bore 2g is disposed on a right-hand side of the first cylinder bore 1g. FIG. 4 is a view showing a section of the base body 100 taken along a line A-A in FIG. 3A is seen from a lower side.

A rear end face 120 of the base body 100 is a portion which is attached to the front surface of the dashboard. As shown in FIG. 2, stud bolts 140 are provided individually in four, top left, top right, bottom left and bottom right corners of the rear end face 120 so as to be erected therefrom.

When the base body 100 is attached to the front surface of the dashboard, the stud bolts 140 are inserted, into attaching holes in the dashboard and distal end portions of the stud bolts 140 are secured to a body frame.

A left half surface of the base body 100 configures the attaching surface 110 where the electronic control unit 7 is attached.

Plural attaching holes 111 are formed in an upper half area of the attaching surface 110 for installation of the electric components such as the solenoid valves V1, V2 and the pressure sensors P, P.

Figure 3B:
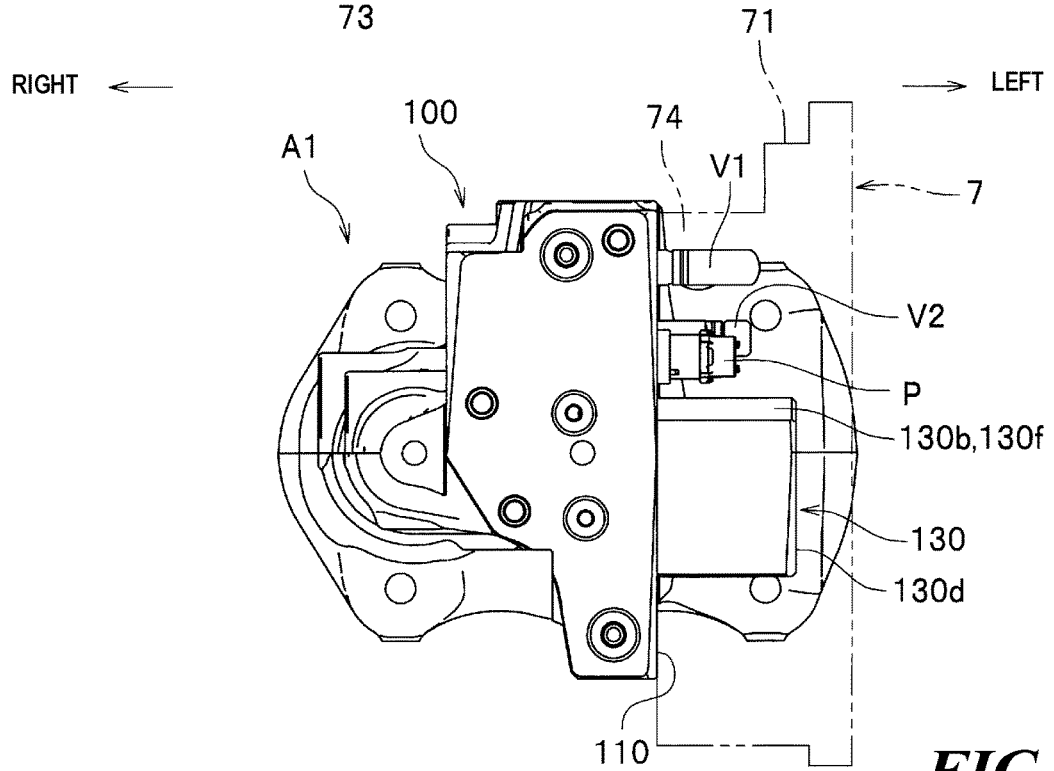

As shown in FIG. 3B, distal end portions of the solenoid valves V1, V2 and the pressure sensors P, P which are installed in the attaching holes 111 project from the attaching surface 110.

As shown in FIG. 2, a substantially rectangular parallelepiped heat radiation portion 130 is provided in a lower half area of the attaching surface 110 so as to project therefrom. The heat radiation portion 130 is a solid projecting portion which is formed integrally with the base body 100. The heat radiation portion 130 is formed so that it expands wider in the cross wise direction than in the vertical direction.

Figure 5:
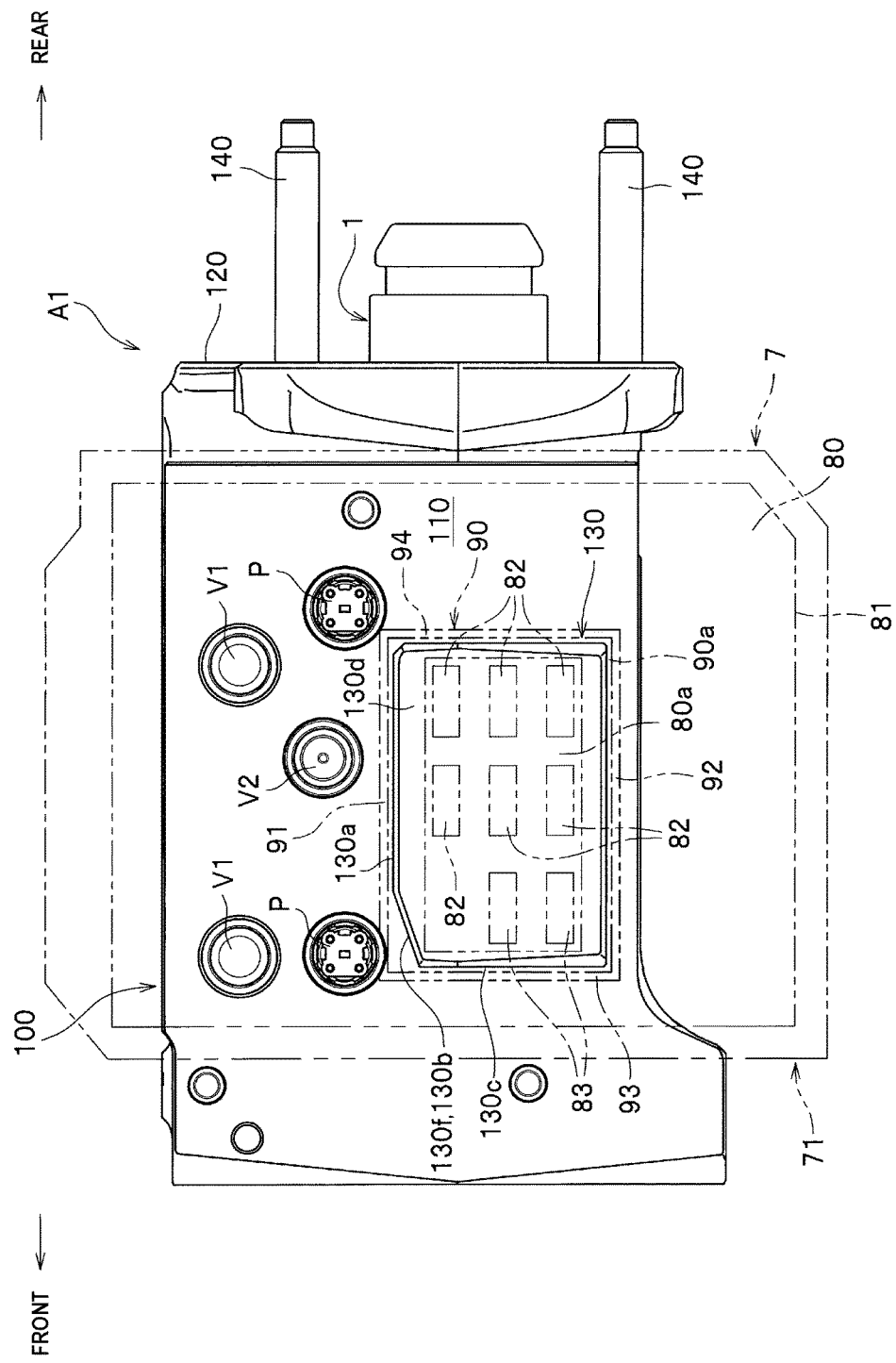
FIG. 5 is a left side view showing the input unit according to the embodiment.

As shown in FIG. 5, the heat radiation portion 130 is disposed below the solenoid valves V1, V2 and the pressure sensors P, P in the vertical direction when the input unit A1 is installed on the vehicle. In this way, the solenoid valves V1, V2, the pressure sensors P, P and the heat radiation portion 130 are provided on the attaching surface 110 so as to be aligned in the up-to-down direction.

As shown in FIG. 3B, the height (the projecting amount from the attaching surface 110) of the heat radiation portion 130 is greater than the heights (the projecting amounts from the attaching surface 110) of the solenoid valves V1, V2 and the pressure sensors P, P.

As shown in FIG. 5, an inclined surface 130b is formed at a front portion of an upper surface 130a of the heat radiation portion 130 so as to be inclined downwards as it extends towards a front end edge of the heat radiation portion 130. Namely, the inclined surface 130b is formed at the front portion of the upper surface 130a of the heat radiation portion 130 so as to be inclined towards a side which is opposite to the front pressure sensor P. The inclined surface 130b of the heat radiation portion 130 confronts the front pressure sensor P, and the front pressure sensor P lies near the inclined surface 130b.

The inclined surface 130h is formed by cutting out the front upper corner portion of the heat radiation portion 130 as compared with the case if the upper surface 130a intersects a front end face 130c at right angles. The inclined surface 130b is also functions as a clearance portion 130f is recessed to avoid the contact with the front pressure sensor P.

The electronic control unit 7 is attached to the attaching surface 110 of the base body 100 as shown in FIG. 4 (refer to FIG. 2).

The electronic control unit 7 includes a box-shaped housing 71 of a synthetic resin and a control circuit board 80 which is housed in the housing 71.

As shown in FIG. 1, the electronic control unit 7 of this embodiment controls the opening and closing of the solenoid valves V1, V2 of the input unit A1 and also controls the operation of the motor 12 of the slave cylinder A2.

The housing 71 includes a substantially rectangular partition portion 72 and a circumferential wall portion 73 which surrounds the partition portion 72 as shown in FIG. 2. The circumferential wall portion 73 is erected from a circumferential edge portion of the partition portion 72 in the vertical direction towards a front side (a left side) and a rear side (a right side).

As shown in FIG. 4, the housing 71 is secured to the attaching surface 110 in such a state that the housing 71 covers the solenoid valves V1, V2 and the pressure sensors P, P which project from the attaching surface 110 of the base body 100.

Attaching holes (not shown) are formed individually in four corners of the circumferential wall portion 73 of the housing 71. Then, bolts which are inserted through the attaching holes are screwed into threaded holes in the base body 100, whereby the housing 71 is secured to the attaching surface 110 of the base body 100.

An opening portion on a front side of the housing 71 is closed tightly by a cover 76 of a synthetic resin (refer to FIG. 2).

An interior space of the housing 71 is separated into a front side (a left side) and a rear side (a right side) by the partition portion 72. The partition portion 72 is a plate-shaped portion which confronts the attaching surface 110 with a space defined therebetween.

A first accommodating chamber 74 is formed between the partition portion 72 and the attaching surface 110. A second accommodating chamber 75 is defined on a side of the partition portion 72 which is opposite to a side facing the attaching surface 110 (a side facing the cover 76).

The first accommodating chamber 74 configures a space where the solenoid valves V1, V2 and the pressure sensors P, P which project from the attaching surface 110 are accommodated, and the second accommodating chamber 75 configures a space where the control circuit board 80 is accommodated.

The control circuit board 80 controls the operation of the solenoid valves V1, V2 (refer to FIG. 1) of the input unit A1 based on the information acquired by the various sensors and the program stored in advance and also controls the operation of the motor 12 (refer to FIG. 1) of the slave cylinder A2.

The control circuit board 80 is such that electronic components are attached to a rectangular circuit board main body 81 on which electronic circuitries are printed (refer to FIG. 2).

As shown in FIG. 4, the control circuit board 80 is secured to a fixing portion which is provided on a front surface of the partition portion 72 so as to project therefrom, whereby the control circuit board 80 is attached to the partition portion 72 in a layered fashion.

A rectangular component attaching area 80a is provided on the control circuit board 80 of this embodiment as shown in FIG. 5. The component attaching area 80 is formed so as to be wider in the front-to-rear direction than in the up-to-down direction and is formed smaller than a distal end face 130d of the heat radiation portion 130. Six motor FETs (Field Effect Transistors) 82 and two current detecting resistor components 83 are attached to a front side of the component attaching area 80a.

A rectangular opening portion 72a is formed in the partition portion 72 so that the heat radiation portion 130 which project from the attaching surface 110 passes through it (refer to FIG. 2).

The heat radiation portion 130 is inserted through the opening portion 72a of the partition portion 72, and a distal end portion (a left end portion) of the heat radiation portion 130 projects into the second accommodating chamber 75. In this way, the distal end face 130d of the heat radiation portion 130 lies closer to the control circuit board 80 than the partition portion 72.

A heat conducting member holding portion 90 is formed along an inner circumferential edge portion of the opening portion 72a of the partition portion 72. The heat conducting member holding portion 90 is erected towards the control circuit board 80 from a front surface of the partition portion 72 and is also erected towards the attaching surface 110 from a rear surface of the partition portion 72.

The heat conducting member holding portion 90 is an angularly cylindrical wall portion (refer to FIGS. 4 and 5) which surrounds the heat radiation portion 130 and extends along a direction in which the heat radiation portion 130 project. A gap 90b (refer to FIG. 6) is formed between a right end portion (an end portion facing the attaching surface 110) of the heat conducting member holding portion 90 and the attaching surface 110 of the base body 100.

The heat conducting member holding portion 90 includes an upper wall portion 91, a lower wall portion 92, a front wall portion 93 and a rear wall portion 94 as shown in FIG. 5.

A left end portion (an end portion facing the control circuit board 80) of the front wall portion 93 is in abutment with a front edge portion of a rear surface of the control circuit board 80 as shown in FIG. 4. A gap 90c (refer to FIG. 6) is formed between left end portions of the rear wall portion 94, the upper wall portion 91 and the lower wall portion 92 (refer to FIG. 5) and the control circuit board 80.

The heat radiation portion 130 is inserted through the angularly cylindrical heat conducting member holding portion 90. The distal end face 130d of the heat radiation portion 130 enters lightly further rightwards than a left end portion (an end portion facing the control circuit board 80) of the heat conducting member holding portion 90.

As shown in FIG. 5, an annular gap 90a (refer to FIG. 6) is formed between an outer circumferential surface of the heat radiation portion 130 and an inner circumferential surface of the heat conducting member holding portion 90.

The heat radiation portion 130 project into the second accommodating chamber 75 through the heat conducting member holding portion 90 as shown in FIG. 4. Then, the distal end face 130d (the left end face) of the heat radiation portion 130 is disposed on a rear side of the component attaching area 80a (refer to FIG. 5).

Figure 6:
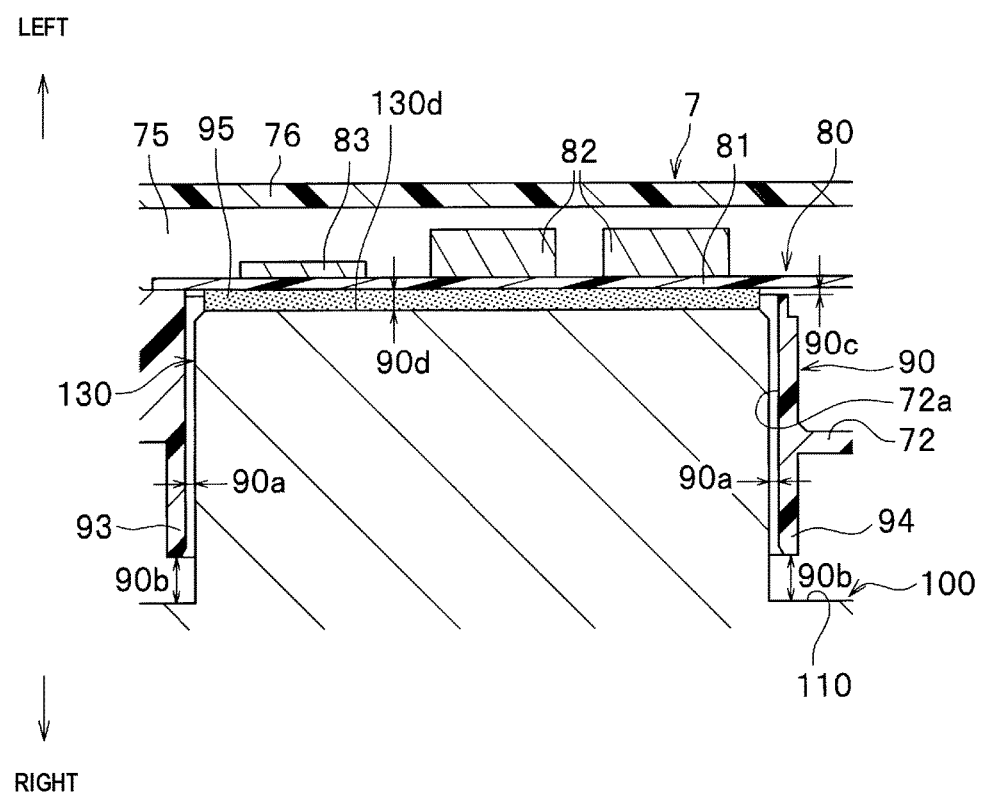
FIG. 6 is an enlarged sectional view showing a positional relationship between a heat radiation portion and a heat conducting member holding portion according to the embodiment.

As shown in FIG. 6, the distal end face 130d of the heat radiation portion 130 is disposed so as to define a gap 90d between the rear surface of the control circuit board 80 and itself. The left end portions of the upper wall portion 91, the lower wall portion 92 and the front wall portion 93 (refer to FIG. 5) of the heat conducting member holding portion 90 are disposed so as to define the gap 90c between the rear surface of the control circuit board 80 and themselves.

The gap 90d formed between the heat radiation portion 130 and the control circuit board 80 is set narrower than the gap 90c formed between the heat conducting member holding portion 90 and the control circuit board 80.

Grease (heat conducting member) 95 having viscosity is applied to the distal end face 130d of the heat radiation portion 130.

In this way, the distal end face 130d of the heat radiation portion 130 is in abutment with the control circuit board 80 via the grease 95.

There is imposed any specific limitation on the type of the grease 95, and hence, various types of grease can be used including oil-based grease and silicone grease.

In the input unit A1 configured in the way described above, the heat radiation portion 130, which is provided on the attaching surface 110 of the base body 100 so as to project therefrom, is in abutment with the control circuit board 80 via the grease 95, and therefore, heat of the control circuit board 80 is conducted to the whole of the base body 100 from the heat radiation portion 130.

Then, the heat is radiated efficiently from the base body, because the base body 100 is the metallic block which is disposed in the wide space in the engine compartment. Consequently, even when the heat generation amount of the control circuit board 80 is great, the heat of the control circuit board 80 can be radiated sufficiently through the base body 100, whereby the increase in temperature of the control circuit board 80 can be restricted.

In the input unit A1, the heat radiation portion 130 of the base body 100 is in abutment with the control circuit board 80 via the grease 95, whereby the generation of a gap between the heat radiation portion 130 and the control circuit board 80 can be prevented. Namely, an assembling tolerance between the heat radiation portion 130 and the control circuit board 80 is absorbed by the grease 95.

In the input unit A1, as shown in FIG. 5, the electronic components (the motor FETs 82 and the current detecting resistor components 83) are attached to the front side of the component attaching area 80a and the heat radiation portion 130 is in abutment with the rear side of the component attaching area 80a.

Consequently, in the input unit A1, heat of the electronic components of the control circuit board 80 is conducted directly to the heat radiation portion 130, and therefore, the heat of the control circuit board 80 can be conducted to the base body 100 efficiently.

As in the vehicle brake system A (refer to FIG. 1) of this embodiment, in the event of the electronic control unit 7 controlling the operation of the input unit A1 and the slave cylinder A2 (refer to FIG. 1), the number of electronic components which are provided on the control circuit board 80 is increased, and hence, the heat generated from the control circuit board 80 is increased. However, in the input unit A1 of this embodiment, the increase in temperature of the control circuit board 80 can be restricted because the heat of the control circuit board 80 can be radiated sufficiently through the base body 100.

In this embodiment, as shown in FIG. 4, the grease 95 provided in the input unit A1 has the viscosity, and therefore, in case excessive vibrations are generated in the input unit A1 while the vehicle is running, there are fears that the grease 95 expands (flows) over the circumference of the heat radiation portion 130. As this occurs, the heat conducting member holding portion 90 restricts the grease 95 from so flowing, and the grease 95 can be held by the heat radiation portion 130. The grease 95 enters the gap 90a formed between the outer circumferential surface of the heat radiation portion 130 and the inner circumferential surface of the heat conducting member holding portion 90, so that the grease 95 stays within the gap 90a. In this way, the grease 95 can be prevented from scattering within the housing 71 because the flow of the grease 95 can be interrupted by the heat conducting member holding portion 90.

Although the gap 90c (refer to FIG. 6) is formed between the heat conducting member holding portion 90 and the control circuit board 80, the size of the gap 90c is set in consideration of the viscosity of the grease 95 so that the grease 95 does not pass through the gap 90c formed between the heat conducting member holding portion 90 and the control circuit board 80.

The gap 90a formed between the outer circumferential surface of the heat radiation portion 130 and the inner circumferential surface of the heat conducting member holding portion 90 is set in consideration of the viscosity of the grease 95 so that the grease 95 stays easily in the gap 90a.

The heat conducting member holding portion 90 is the angularly cylindrical wall portion which surrounds the full circumference of the heat radiation portion 130 and the gap 90a is defined around the full circumference of the heat radiation portion 130. Thus, the grease 95 is allowed to stay between the heat radiation portion 130 and the heat conducting member holding portion 90 (the wall portion) in an ensured fashion.

In the input unit A1, as shown in FIG. 5, the heat radiation portion 130 is disposed below the solenoid valves V1, V2 (refer to FIG. 3B), and the heat of the solenoid valves V1, V2 is radiated upwards. Thus, the heat of the solenoid valves V1, V2 can be prevented from being conducted to the control circuit board 80 through the heat radiation portion 130.

It is difficult for the grease 95 to expand upwards, and therefore, the grease 95 can be prevented from adhering to the solenoid valves V1, V2 and the pressure sensors P in an ensured fashion.

In the input unit A1, as shown in FIG. 4, the heat of the heat radiation portion 130 is made difficult to be conducted to the spaces in the both accommodating chambers 74, 75 by the angularly cylindrical heat conducting member holding portion 90, and therefore, the increase in temperature within the housing 71 can be restricted.

In the input unit A1, as shown in FIG. 5, the solenoid valves V1, V2 and the pressure sensors P, P and the heat radiation portion 130 are disposed in parallel in the up-to-down direction in the housing 71. The clearance portion 130f is formed at the front portion of the upper surface 130a of the heat radiation portion 130. This allows the heat radiation portion 130 and the front pressure sensor P to lie near to each other. In this way, the housing 71 can be reduced in size by disposing the heat radiation portion 130 and the electric components in a compact fashion.

The invention is not limited to the above-described embodiment and can be altered or modified as required without departing from the spirit and scope thereof.

In this embodiment, the vehicle control unit is described as being applied to the input unit A1 of the vehicle brake system A shown in FIG. 1. However, the vehicle control unit of the embodiment can be applied to various control units which are installed on the vehicle. For example, the vehicle control unit of the embodiment can also be applied to the slave cylinder A2 and the hydraulic control unit A3 of the vehicle brake system A.

As shown in FIG. 2, in this embodiment, the single heat radiation portion 130 is provided on the attaching surface 110 to project therefrom. However, plural heat radiation portions may be provided on the attaching surface so as to project therefrom.

A position for disposing the heat radiation portion 130 is not limited to that described in the embodiment and can be set in consideration of the layout of the hydraulic paths in the base body 100 and the electric components attached to the base body 100.

The invention claimed is:

1. A vehicle control unit including:
a metallic base body; and
an electronic control unit which is attached to the base body,
wherein the electronic control unit includes:
a housing which is attached to an attaching surface of the base body; and
a control circuit board which is housed in the housing,
wherein a heat radiation portion is provided on the attaching surface so as to be inserted into the housing,
wherein the heat radiation portion is brought into abutment with the control circuit board via a heat conducting member having viscosity,
wherein a heat conducting member holding portion is formed in the housing so as to hold the heat conducting member with respect to the heat radiation portion,
wherein the heat conducting member holding portion includes a wall which surrounds the heat radiation portion,
wherein a gap is formed between the wall of the heat conducting member holding portion and an outer wall of the heat radiation portion, and
wherein a size of the gap allows the heat conducting member to flow into the gap and be prevented from scattering within the housing due to interruption by the heat conducting member holding portion.

2. The vehicle control unit of claim 1,
wherein the heat conducting member holding portion is a cylindrical wall portion which surrounds the heat radiation portion.

3. The vehicle control unit of claim 2,
wherein the gap is formed between an outer circumferential surface of the heat radiation portion and an inner circumferential surface of the wall portion.

4. The vehicle control unit of claim 2,
wherein the heat radiation portion projects from the attaching surface towards the control circuit board, and
wherein the wall portion extends along a projecting direction of the heat radiation portion.

5. The vehicle control unit of claim 1,
wherein an electric component is attached to the attaching surface and
wherein, in a state of being installed on a vehicle, the heat radiation portion is disposed below the electric component in a vertical direction.

6. A vehicle brake system including:
a master cylinder which generates a brake hydraulic pressure depending on a traveling amount of a brake operating member;
a slave cylinder which generates a brake hydraulic pressure by driving an electric actuator; and
the vehicle control unit of claim 1,
wherein the electronic control unit of the vehicle control unit controls the electric actuator.

7. The vehicle control unit of claim 1, wherein the heat conducting member is held by the heat radiation portion.

8. The vehicle control unit of claim 1, wherein the base body is formed to expand more in a front-to-rear direction than in a left-to-right direction and a rear end portion of the base body is made wider in the left-to-right direction.

9. The vehicle control unit of claim 1, wherein the heat radiation portion is a solid projecting portion which is formed integrally with the base body and which is formed so that it expands wider in a cross wise direction than in a vertical direction.

10. The vehicle control unit of claim 9,
wherein an inclined surface is formed at a front portion of an upper surface of the heat radiation portion so as to be inclined downwards as it extends towards a front end edge of the heat radiation portion,
wherein the inclined surface is a cut out in a front upper corner portion of the heat radiation portion, and
wherein the inclined surface functions as a clearance portion to avoid contact with a front pressure sensor.

11. The vehicle control unit of claim 1,
wherein the housing includes a substantially rectangular partition portion and a circumferential wall portion which surrounds the partition portion,
wherein an interior space of the housing is separated into a first side and a second side by the partition portion,
wherein a first accommodating chamber is between the partition portion and the attaching surface, and
wherein a second accommodating chamber is defined on a side of the partition portion which is opposite to a side facing the attaching surface.

12. The vehicle control unit of claim 11,
wherein an opening portion is formed in the partition portion so that the heat radiation portion which projects from the attaching surface passes through the opening portion, and
wherein the heat conducting member holding portion is formed along an inner circumferential edge portion of the rectangular opening portion of the partition portion.

13. The vehicle control unit of claim 1, wherein the heat conducting member holding portion is a cylindrical wall portion which surrounds the heat radiation portion and extends along a direction in which the heat radiation portion project.

14. The vehicle control unit of claim 1,
wherein the heat conducting member holding portion includes an upper wall portion, a lower wall portion, a front wall portion and a rear wall portion,
wherein an end portion facing the control circuit board of the front wall portion is in abutment with a front edge portion of a rear surface of the control circuit board, and
wherein a second gap is formed between end portions of the rear wall portion, the upper wall portion and the lower wall portion and the control circuit board.

15. The vehicle control unit of claim 14, wherein the heat radiation portion is inserted through the cylindrical heat conducting member holding portion and the gap is formed between an outer circumferential surface of the heat radiation portion and an inner circumferential surface of the heat conducting member holding portion.

16. The vehicle control unit of claim 15, wherein a distal end face of the heat radiation portion is disposed so as to define a third gap which is between the rear surface of the control circuit board and itself.

17. The vehicle control unit of claim 16, wherein the end portions of the upper wall portion, the lower wall portion and the front wall portion of the heat conducting member holding portion are disposed so as to define the second gap between the rear surface of the control circuit board and themselves.

18. The vehicle control unit of claim 17, wherein a fourth gap is between the heat radiation portion and the control circuit board which is set narrower than the second gap formed between the heat conducting member holding portion and the control circuit board.

\* \* \* \* \*